United States Patent [19]
Parrette

[11] Patent Number: 5,725,663
[45] Date of Patent: Mar. 10, 1998

[54] APPARATUS FOR CONTROL OF CONTAMINATION IN SPIN SYSTEMS

[75] Inventor: William Parrette, Milpitas, Calif.

[73] Assignee: Solitec Wafer Processing, Inc., San Jose, Calif.

[21] Appl. No.: 593,323

[22] Filed: Jan. 31, 1996

[51] Int. Cl.⁶ .................. B05C 11/02; B05C 13/00; B05C 13/02; B05C 5/00
[52] U.S. Cl. ............... 118/52; 118/56; 118/319; 118/320; 118/500
[58] Field of Search ............... 118/52, 56, 319, 118/320, 500

[56] References Cited

U.S. PATENT DOCUMENTS

| | | | |
|---|---|---|---|
| 3,870,014 | 3/1975 | Buck | 118/52 |
| 4,790,262 | 12/1988 | Nakayama et al. | 118/52 |
| 5,472,502 | 12/1995 | Batchelder | 118/52 |
| 5,492,566 | 2/1996 | Sumnitsch | 118/500 |
| 5,529,626 | 6/1996 | Stewart | 118/500 |

FOREIGN PATENT DOCUMENTS

| | | | |
|---|---|---|---|
| 63-219126 | 9/1988 | Japan | 118/52 |
| 4-197468 | 7/1992 | Japan | 118/52 |
| 5-109612 | 4/1993 | Japan | 118/52 |
| 5-200350 | 8/1993 | Japan | 118/52 |
| 5-283327 | 10/1993 | Japan | 118/52 |
| 6-99125 | 4/1994 | Japan | 118/52 |
| 6-132211 | 5/1994 | Japan | 118/52 |

Primary Examiner—Donald E. Czaja
Assistant Examiner—Jacqueline A. Ruller
Attorney, Agent, or Firm—Limbach & Limbach

[57] ABSTRACT

A substrate wafer processing method and apparatus is disclosed utilizing a bowl having a central axis, a baffle surface positioned above the inside bottom surface of the bowl and a chuck member having a top surface for supporting and spinning substrate and positionable coaxially within the bowl closely spaced from the baffle surface. Means and methods are described for directing a gas stream radially outwardly between the bottom surface of the chuck member and the baffle. The specific surface construction of the baffle is disclosed as part of a plenum member as well as a deflecting surface that projects to a level above the top surface of the substrate.

8 Claims, 2 Drawing Sheets

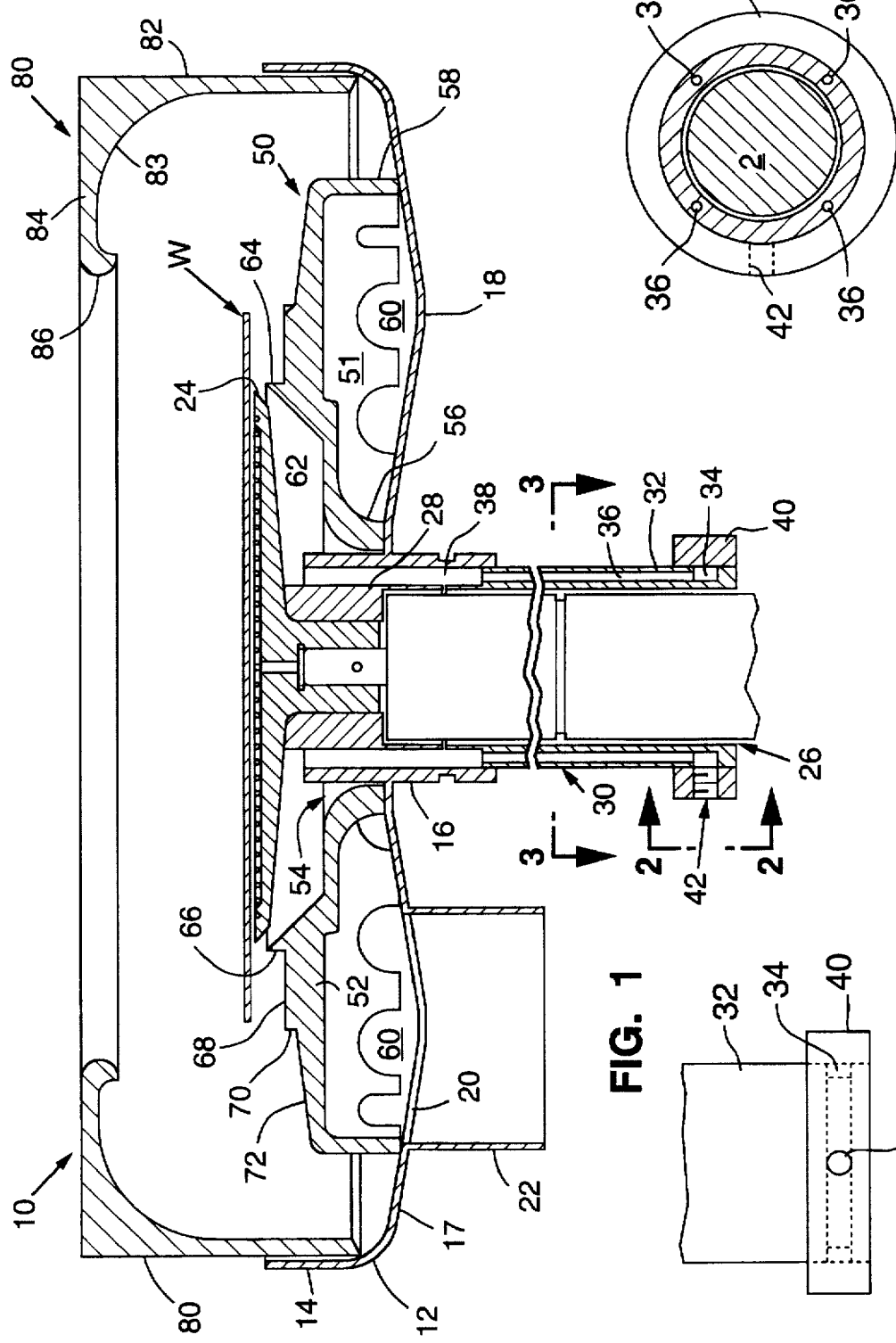

APPARATUS FOR CONTROL OF CONTAMINATION IN SPIN SYSTEMS

FIELD OF THE INVENTION

The present application is directed in general to method and apparatus for control of contamination in spin systems and particularly spin systems used for coating surfaces of substrates.

BACKGROUND OF THE INVENTION

In typical semi-conductor substrate wafer processing, the substrate is held down on a chuck that spins within a process bowl, and a liquid coating material is applied to the surface. A common problem with such spin systems is that the liquid being spun off substrate becomes atomized. This atomized liquid then mixes with the air flow within the process bowl and either re-coats the surface or coats the backside of the substrate. This contamination problem has been amplified more recently due to the increase of the diameter of the substrates being used today.

Applicant has developed a method and apparatus that balances the exhaust within the process bowl, minimizes the spacing between the substrate and a baffle plenum, blocks reverse air flow under the substrate, provides clean purging gas for backfill under the substrate and redirects air flow away from over the substrate.

SUMMARY OF THE INVENTION

Broadly stated, the present invention is directed to method and apparatus utilizing a bowl having a central axis, a baffle surface positioned above the inside bottom surface of the bowl, a chuck member having a top surface for supporting and spinning a substrate and positionable coaxially within the bowl closely spaced from the baffle surface and means for directing a gas stream radially outwardly between the bottom surface of the chuck member and the baffle to block reverse air flow under the substrate, provide clean backfilling gas under the substrate and redirecting air flow away from the substrate.

In accordance with another aspect of the present invention as last aforementioned the baffle surface includes an upwardly outwardly angled baffle surface which ends in an edge close to the outer edge of said wafer chuck and the lower surface of the substrate and a first downward step at said baffle edge to a surface extending radially outwardly substantially parallel to the bottom surface of the substrate to a second downward step substantially vertically below the outer edge of the substrate.

In accordance with another aspect of the present invention, a plenum member is positioned above the bottom of the bowl with its top surface serving as the baffle surface spaced closely from the bottom of the chuck member and substrate and defining a lower plenum chamber with access thereto evenly around the substrate for balanced exhaust from the bowl.

In accordance with still another aspect of the present invention, apparatus and method provide a deflecting surface projecting from the outer edge of the bowl inwardly to a level above the top surface of the substrate with a rounded deflector lip at the inner edge of the deflecting surface projecting downward the bowl to cause air and liquid coming off a substrate to flow to the bottom of the bowl.

Further aspects of the present invention and the advantages thereof will become apparent from a consideration of the drawings and ensuing description.

BRIEF DESCRIPTION OF THE DRAWINGS

FIG. 1 is an elevational cross-sectional view of a spin coating apparatus in accordance with the present invention.

FIG. 2 is a side elevational view of a portion of the structure shown in FIG. 1 taken along line 2—2 in the direction of the arrows.

FIG. 3 is a cross-sectional view of a portion of the structure shown in FIG. 1 taken along line 3—3 in the direction of the arrows.

DETAILED DESCRIPTION OF THE PREFERRED EMBODIMENT

Figure 4:
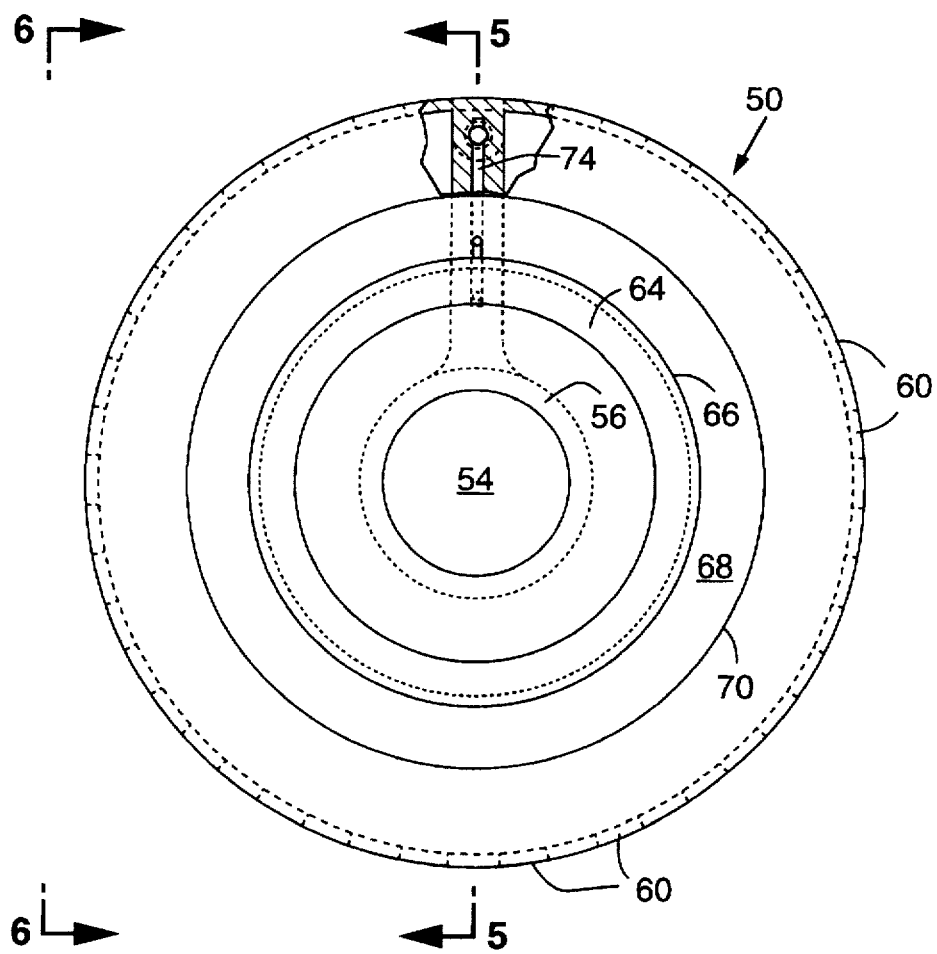
FIG. 4 is a top plane view, partially broken away, of the plenum member shown in FIG. 1.

Referring now to the drawing with particular reference to FIG. 1, there is shown a spin coating assembly 10 in accordance with the preferred embodiment of the present invention including a bowl 12 such as of stainless steel having an upwardly extending outer peripheral edge 14 and a central, vertically aligned hollow cylindrical sleeve 16 projecting upwardly and downwardly from the bottom 17 of the bowl 12. The bowl has a circular depression 18 in between the peripheral edge 14 and the central sleeve 16 with a circular exhaust opening 20 centered over the depression 18 and with a hollow cylindrical exhaust tube 22 extending downwardly from the exhaust opening 20. Another aperture (not shown) is located in the bottom surface 17 for allowing passage into the bowl of a fluid for back rinse of the wafer chuck and substrate as more fully described below.

A wafer chuck 24 for supporting a substrate or wafer W is mounted on the top end of a spindle assembly 26 which can raise up to receive and discharge a wafer and lower down into the bowl for spin coating the top surface of the wafer W with a liquid coating that is directed down onto the top surface of the wafer. A cylindrical skirt 28 is provided around the top of the spindle assembly 26.

As shown in FIGS. 1–3, a collar 30 having a hollow cylindrical tubular portion 32 is securely fastened to the lower inner periphery of the bowl sleeve 16. The lower end of the tubular collar portion 32 is provided in its outer surface with an annular recess 34 which communicates with a plurality of elongate passages 36 extending upwardly through the tubular collar portion 32 into an annular opening 38 between the bowl sleeve 16 and the spindle assembly 26. A annular ring 40 having an aperture 42 therein surrounds and seals the recess 34 so that connection can be made at the aperture 42 to a source of gas such as nitrogen which is passed through the aperture 42 into annual recess 34, then up through the longitudinal passages 36 into the annular opening 38 and then radially outward along the lower surface of the wafer chuck 24 and the lower surface of the substrate W.

As shown in FIGS. 1 and 4–6, a inverted cup shaped plenum member 50, such as of polytetrafluoroethylene, is provided with a ring shaped main body 52 having a central opening 54 from which an inner circular flange 56 extends downwardly to rest on the bowl bottom 17 adjacent the central sleeve 16 and an outer peripheral flange wall 58 extends down to rest on the bowl bottom 17 radially outward beyond the outer periphery of the wafer W. The outer peripheral flange wall 58 includes a plurality of semicircular scalloped openings 60 around its lower edge to allow uniform exhaust of liquid, gas and particulate material into a plenum chamber 51 for exhaust through tube 22.

The main body 52 of the plenum member 50 includes an upwardly outwardly angled surface portion 62 which ends in an edge 64 close to the lower outer edge of the wafer chuck 24 and the outer lower surface of the wafer W. From the outer edge 64, the plenum member main body 52 is provided with a first vertically downward step 66 to a substantially flat horizontal surface portion 68 which is substantially parallel to the bottom surface of the substrate W and ends in a second vertically downward step 70 from which a downwardly sloping surface portion 72 of the plenum main body 32 extends to the outer peripheral flange 58.

Figure 5:
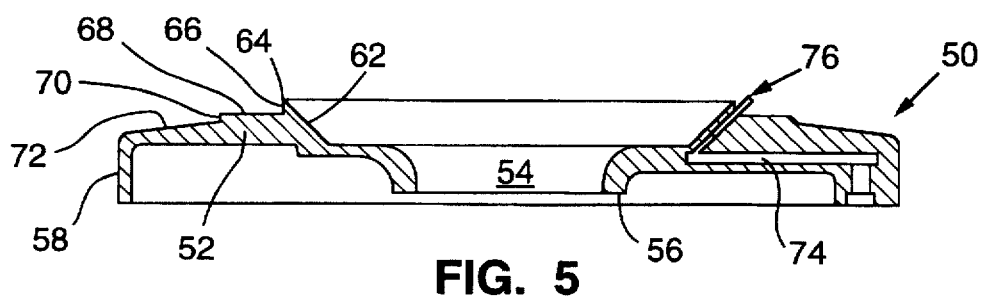
FIG. 5 is a sectional view of a portion of the structure shown in FIG. 4 taken along line 5—5 in the direction of the arrows.
Figure 6:
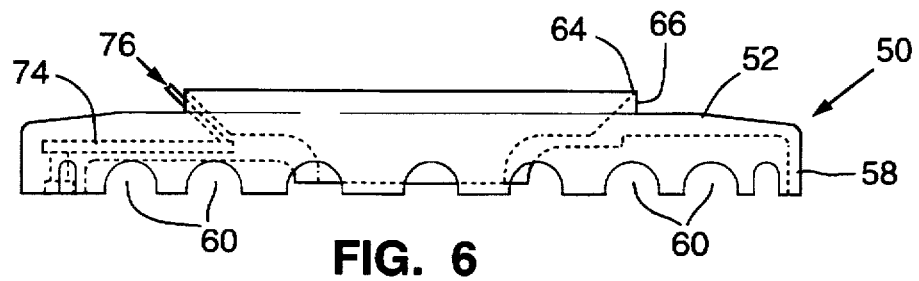
FIG. 6 is a side elevational view of the structure shown in FIG. 4 taken along line 6—6 in the direction of the arrows.

As shown in FIGS. 4–6 a backwash liquid channel 74 is provided in the main body 52 with an end press fit nozzle 76 projecting outwardly from the first step surface 66. Backside rinse liquid can be directed through the channel 74 and out nozzle 76 to wash the outer backside of the wafer W.

The upper central shape of the plenum main body 52 serves as a baffle surface positioned close to the wafer chuck 24 and wafer lower surface for minimizing the space between the substrate and the plenum member, blocking reverse air flow under the substrate with clean gas such as N2 for back-filling under the substrate and flowing gas across the bottom of the substrate to direct any liquid or particulate that may have collected there radially outward of the bowl for movement through the scalloped openings 60 into the plenum chamber 51 and out the circular drain 20 and tube 22.

A tunnel shield 80, such as of polytetrafluoroethylene, is provided with a hollow cylindrical wall 82 that slidable fits within the peripheral edge wall 14 of the bowl 12 and extends upwardly via an inwardly radiused curved surface 83 to a top deflector portion 84 projecting from the cylindrical edge wall 82 inwardly to a level above the top surface of a substrate W positioned on the top surface of the chuck member 24 when the chuck member 24 is in its lowered position in the bowl. Top deflector 84 has a rounded inner deflector lip 86 which projects downwardly toward the bowl 12 to cause air and the liquid coming off a substrate to flow around the inner curved surface 83 of the tunnel shield 80, down to the bottom of the bowl 12, through the openings 60 into the plenum chamber 51 and then out the circular exhaust opening 20.

The plenum chamber 51 provides a vacuum source or reservoir under the substrate W to exhaust evenly around the substrate W and minimize open space below the substrate W which could contribute to wafer backside contamination. The step 70 on the upper surface of the plenum member 50 reduces the flow of air going under the wafer W.

It has been discovered that the construction of the tunnel shield 80 avoids the problem that pressurized liquid coming out of the application nozzle onto the upper surface of the wafer W spins off the wafer, then bounces back off the sides of the bowl 12 causing the liquid to be redeposited on the wafer W and driven outside the process bowl.

It is to be understood that the present invention is not limited to the embodiments described above and illustrated herein, but encompasses any and all variations falling within the scope of the appended claims.

What is claimed is:

1. Apparatus for spin coating a substrate comprising, in combination:

a bowl having a central axis, a baffle surface positioned above the inside bottom surface of said bowl, a chuck member having a top surface for supporting and spinning a substrate, said chuck member positionable coaxially within said bowl with the bottom surface of the substrate closely spaced from said baffle surface, said baffle surface including an upwardly outwardly angled surface which ends in an edge close to the outer edge of said chuck member and the lower surface of the substrate, and means for directing a gas stream radially outwardly between the bottom surface of the substrate and said baffle surface to block reverse air flow under the substrate and to direct any liquid particulate under the substrate radially outwardly of said bowl.

2. The apparatus of claim 1 including a deflecting surface projecting from the outer edge of said bowl inwardly to a level above the top surface of a substrate positioned on said top surface of said chuck member, said deflecting surface having a rounded deflector lip at the inner edge thereof and projecting downward toward said bowl.

3. The apparatus of claim 1 including a drain opening in the bottom of said bowl and a plenum member positioned above the bottom of said bowl and defining a plenum chamber with access thereinto evenly around the substrate for balanced exhaust from said bowl.

4. The apparatus of claim 3 wherein said plenum member includes said baffle surface.

5. Apparatus for spin coating a substrate comprising, in combination:

a bowl having a central axis, a drain opening in the bottom of said bowl, a chuck member having a top surface for supporting and spinning a substrate, said chuck member positioned coaxially within said bowl, a plenum member positioned above the bottom of said bowl and defining a plenum chamber with access thereunto evenly around the substrate for balanced exhaust from said bowl, said plenum member having an upwardly, outwardly angled baffle surface which ends in an edge close to the outer edge of said wafer chuck and the lower surface of the substrate, said baffle surface having a first downward step at said baffle edge to a surface extending radially outwardly substantially parallel to the bottom surface of the substrate to a second downward step substantially vertically below the outer edge of the substrate, and means for directing a gas stream outwardly between the bottom surface of the substrate and said baffle surface to block reverse air flow under the substrate and to direct any liquid or particulate under the substrate radially outwardly of said bowl.

6. Apparatus for spin coating a substrate comprising, in combination:

a bowl having a central axis and a drain opening in the bottom of said bowl, a plenum member positioned above the bottom of said bowl and defining a plenum chamber with access thereunto evenly around the substrate for balanced exhaust from said bowl, said plenum member including an upwardly outwardly angled baffle surface which ends in an edge close to the lower surface of the substrate, a chuck member having a top surface for supporting and spinning a substrate, said chuck member positionable coaxially within said bowl with the bottom surface of the substrate closely spaced from said baffle surface, and means for directing a gas stream radially outwardly between the bottom surface of the substrate and said baffle surface to reduce the flow of air and particles from within said bowl to the bottom surface of the substrate.

7. The apparatus of claim 6 including a deflecting surface projecting from the outer edge of said bowl inwardly to a level above the top surface of a substrate positioned on said top surface of said chuck member, said deflecting surface having a rounded deflector lip at the inner edge thereof and projecting downward toward said bowl.

8. Apparatus for spin coating a substrate comprising, in combination:

a bowl having a central axis and a drain opening in the bottom of said bowl, a plenum member positioned above the bottom of said bowl and defining a plenum chamber with access thereunto evenly around the substrate for balanced exhaust from said bowl, said plenum member including an upwardly outwardly angled baffle surface which ends in an edge close to the lower surface of the substrate, said baffle surface including a first downward step at said baffle edge to a surface extending radially outwardly substantially parallel to the bottom surface of the substrate to a second downward step substantially below the outer edge of the substrate, a chuck member having a top surface for supporting and spinning the substrate, said chuck member positionable coaxially within the bowl with the bottom surface of the substrate closely spaced from said baffle surface, and means for directing a gas stream radially outwardly between the bottom surface of the substrate and said baffle surface to block reverse air flow under the substrate and to direct any liquid or particulate under the substrate radially outwardly of said bowl.

* * * * *